(12) United States Patent  
Fan

(10) Patent No.: US 7,471,157 B2
(45) Date of Patent: Dec. 30, 2008

(54) LOW POWER/ZERO-OFFSET CHARGE PUMP CIRCUITS FOR DLLS AND PLLS

(75) Inventor: Yongping Fan, Portland, OR (US)

(73) Assignee: Intel Corporation, Santa Clara, CA (US)

(*) Notice: Subject to any disclaimer, the term of this patent is extended or adjusted under 35 U.S.C. 154(b) by 122 days.

(21) Appl. No.: 11/471,756

(22) Filed: Jun. 20, 2006

(65) Prior Publication Data

US 2008/0007347 A1    Jan. 10, 2008

(51) Int. Cl.
*H03L 7/00*    (2006.01)
(52) U.S. Cl. .................. 331/16; 331/185; 327/156; 327/159; 327/161
(58) Field of Classification Search .......... 331/16, 331/185
See application file for complete search history.

(56) References Cited

U.S. PATENT DOCUMENTS

| | | | | |
|---|---|---|---|---|
| 5,508,660 | A | * | 4/1996 | Gersbach et al. .............. 331/17 |
| 6,107,889 | A | * | 8/2000 | Strange et al. ................ 331/17 |
| 6,710,665 | B2 | * | 3/2004 | Maneatis ...................... 331/17 |
| 6,721,379 | B1 | * | 4/2004 | Cranford et al. ............ 375/376 |

* cited by examiner

*Primary Examiner*—Arnold Kinkead
(74) *Attorney, Agent, or Firm*—Schwabe, Williamson & Wyatt, P.C.

(57) ABSTRACT

A charge pump that generates a bias input to affect an output voltage of the charge pump is described herein. The charge pump may include a charge pump stage, a replica charge pump stage, and a self-biased differential amplifier. In some instances, the charge pump may be incorporated into a delay locked loop or a phase locked loop.

21 Claims, 6 Drawing Sheets

10

LOW POWER/ZERO-OFFSET CHARGE PUMP CIRCUITS FOR DLLS AND PLLS

TECHNICAL FIELD

Embodiments of the present invention relate to the field of integrated circuits, more specifically, to charge pumps having particular applications for closed-loop circuits, such as Delay Locked Loops and Phase Locked Loops.

BACKGROUND

Modern integrated circuits, such as microprocessors, utilize clock signals in order to synchronize different parts of the circuits. In order to provide such clock signals, closed-loop circuits such as Delay Locked Loops (DLLs) and Phase Locked Loops (PLLS) are often employed in order to distribute synchronized clock signals. The clock signals outputted by these clocking circuits are typically received by various parts (referred to as receivers) of the integrated circuit to synchronize the operations of such parts.

As input/output (I/O) data rates become increasingly higher reaching, for example, 6.4 GHz or higher in some cases, the data eye for receivers of clock signals is often reduced to about 70 ps due to supply noise, jitter, and frequency dependent attenuation. To reduce data error rate, it is generally preferable that the sampling clocks generated by, for example, DLLs and PLLs be placed at the centers of the data eyes, which require that the phase error of the DLLs and PLLs be zero or close to zero. Unfortunately because of varying frequency and process/voltage/temperature (PVT) conditions, obtaining phase errors of zero or near zero using conventional DLL and PLL designs may be difficult to achieve.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF ILLUSTRATIVE EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

The description may use perspective-based descriptions such as up/down, back/front, and top/bottom. Such descriptions are merely used to facilitate the discussion and are not intended to restrict the application of embodiments of the present invention.

For the purposes of the present invention, the phrase "A/B" means A or B. For the purposes of the present invention, the phrase "A and/or B" means "(A), (B), or (A and B)." For the purposes of the present invention, the phrase "at least one of A, B and C" means "(A), (B), (C), (A and B), (A and C), (B and C) or (A, B and C)." For the purposes of the present invention, the phrase "(A)B" means "(B) or (AB)," that is, A is an optional element.

The description may use the phrases "in various embodiments," or "in some embodiments," which may each refer to one or more of the same or different embodiments. Furthermore, the terms "comprising," "including," "having," and the like, as used with respect to embodiments of the present invention, are synonymous.

According to various embodiments of the present invention, an adaptive zero-offset charge pump (herein "charge pump") is provided that may reduce the phase errors of DLLs and/or PLLs without consuming large amounts of power regardless of varying frequency and PVT conditions. In some embodiments, the charge pump may include an output terminal and a charge pump stage coupled to the output terminal to output at the output terminal a control voltage. The control voltage in some embodiments, may be used to control the operations of delay cells in the case of DLLs and voltage controlled oscillator in the case of PLLs. The charge pump may further include a feedback loop coupled to the charge pump stage to generate a bias input for the charge pump stage to affect the output of the output stage. In some embodiments, the feedback loop may include a self-biased differential amplifier and a replica charge pump stage.

Figure 1:
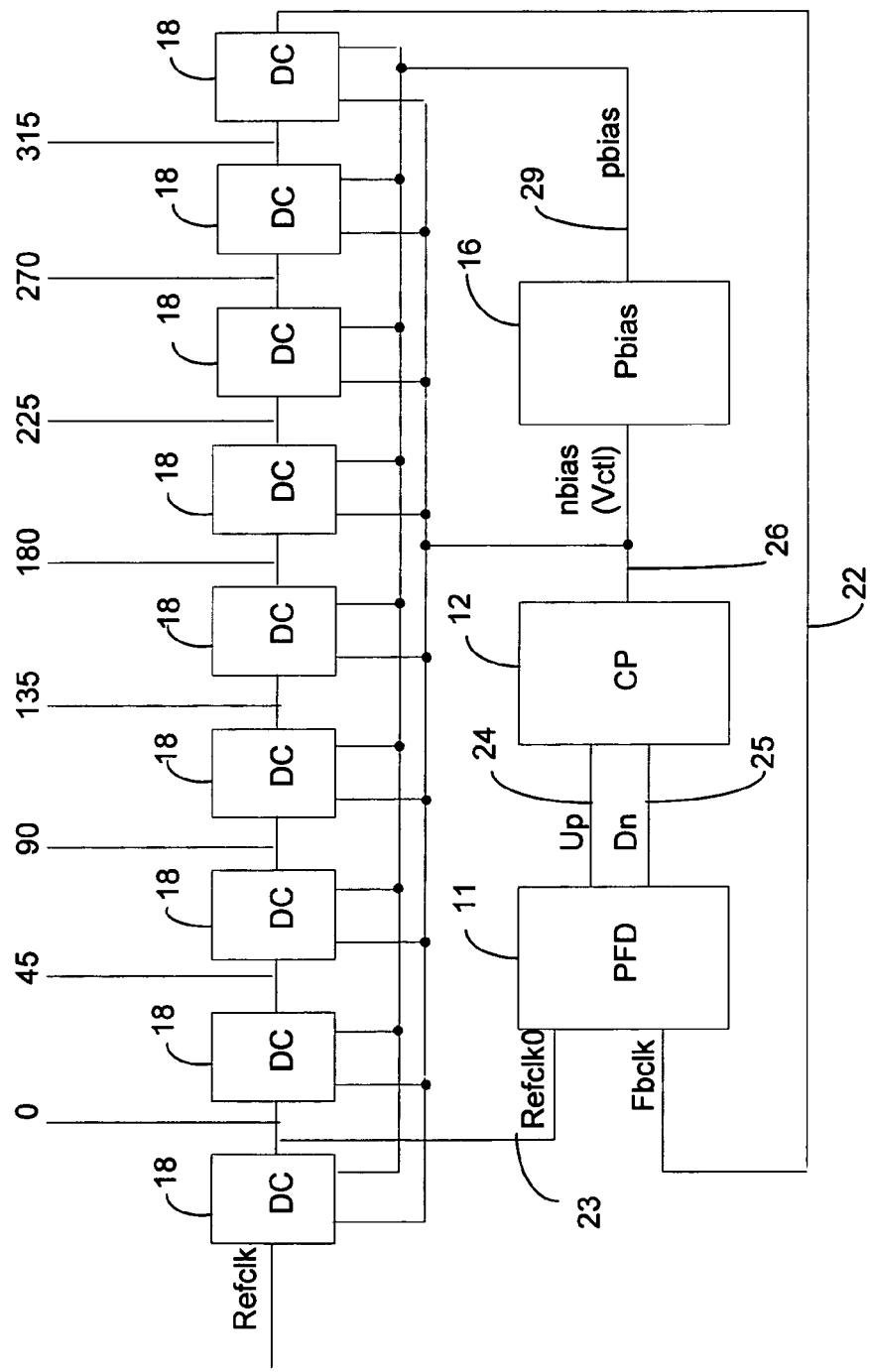
FIG. 1 illustrates selected portions of a DLL in accordance with various embodiments of the present invention.

FIG. 1 depicts selected portions of a DLL in accordance with various embodiments of the present invention. The DLL 10, for the embodiments, includes a phase frequency detector (PFD) 11, a charge pump (CP) 12, delay cells 18 (which may be referred to as a DLL delay line), and a pbias generator 16. The DLL 10 further includes a feedback loop 22 to provide a feedback clock 22 back to the PFD 11. Note that the numbers 0, 45, 90, and so forth, at the top of the figure indicate the phase delays as a result of the delay cells 18.

In order to output clock signals, the PFD 11 receives a reference clock 23 and the feedback clock 22. The PFD 11 then compares the feedback clock 22 to the reference clock 23 and depending upon whether the feedback clock 22 is out-of-phase with the reference clock 23, generates an up signal 24 and/or down signal 25. In particular, the PFD 11 selectively generates up and/or down signals 24 and 25 depending upon whether the feedback clock 22 is "behind" or "ahead," or is in-phase with the reference clock 23. If the feedback clock 22 is in-phase or synchronous with the reference clock 23, then the PFD 11 generates both up and down signals (i.e., up and down signal pulses) that have the same pulse widths.

Based on the up and/or down signals 24 and 25 received from the PFD 11, the CP 12 generates or control a control voltage (nbias or Vctl) 26, which is an nbias voltage to be provided to the delay cells 18 and the pbias generator 16. The pbias generator 16 in turn and based on the nbias voltage provided by the CP 12 may generate a pbias voltage 29. The control voltage 26 (i.e., nbias voltage), along with pbias voltage 29 provided by the pbias generator 16, is then used to control delay cells 18 so that the output clock generated by the delay cells 18 may be in-phase with the reference clock 23.

In conventional DLLs (as well as conventional PLLs), frequency and PVT variations may create large phase errors within the DLLs that may prevent the DLLs from providing uniformly spaced sampling clock signals. According to various embodiments of the present invention, the CP 12 of the DLL 10 described above may be particularly designed to reduce such phase errors to zero or near zero phase error as will be described below. Note that although in the following description the CP 12 will be generally described in a DLL environment, it may also be employed in PLLs to likewise reduce phase errors to zero or near zero. That is, since the structure and components of a PLL is similar to those of a DLL, the CP 12 may also be employed in a PLL. One notable difference is that instead of delay cells 18 (as included in a DLL), the PLL instead includes a voltage controlled oscillator (VCO) that will receive the output voltage (i.e., control voltage 26). As a result, the VCO, like the delay cells 18 of the DLL 10, may output a clock signal.

Figure 2:
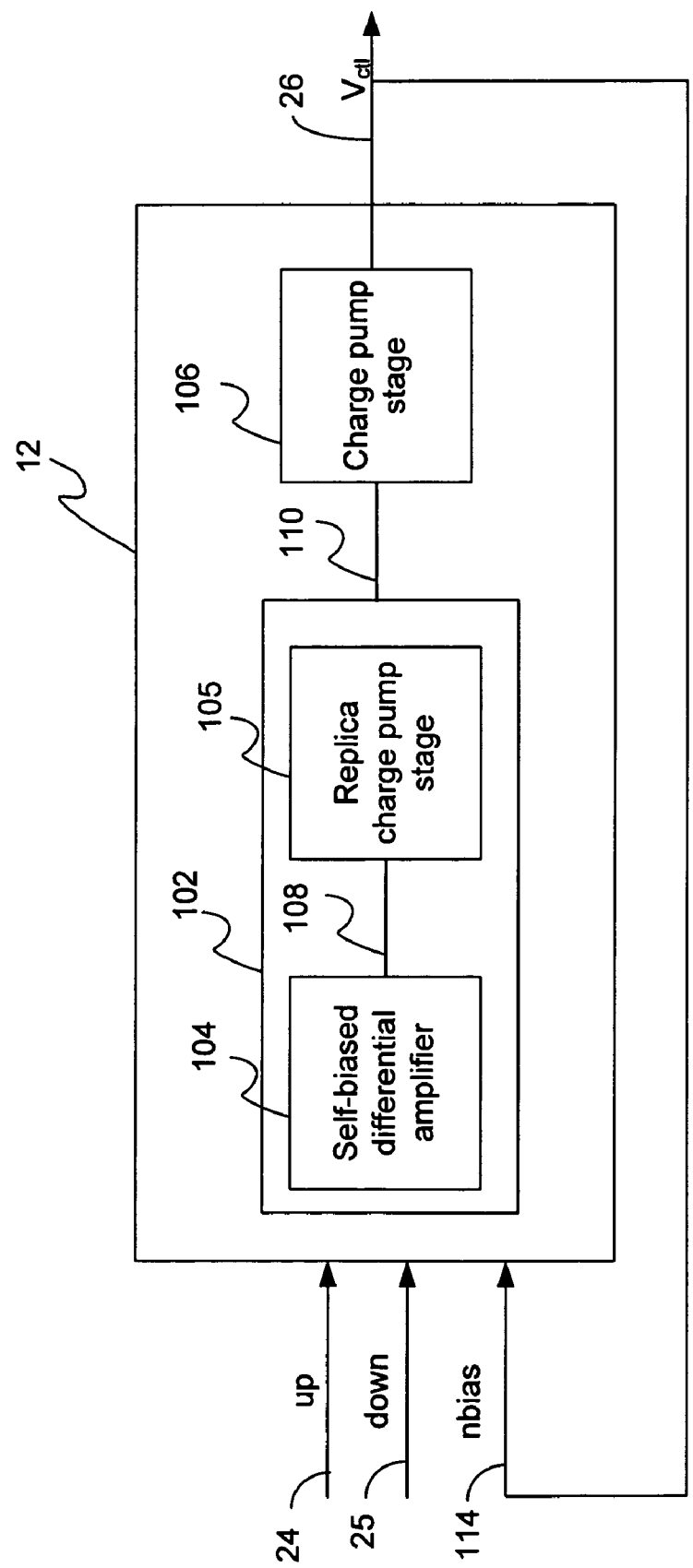
FIG. 2 illustrates a charge pump in accordance with various embodiments of the present invention.

FIG. 2 depicts a block diagram of the charge pump (CP) 12 of FIG. 1 in accordance with various embodiments of the present invention. The CP 12 comprises a feedback loop 102 that includes a self-biased differential amplifier 104 and a replica charge pump (CP) stage 105, and a charge pump (CP) stage 106, coupled together as shown. Links 108 and 110, in various embodiments, may be multiple links as will be shown in FIG. 3. As illustrated, the CP 12 is adapted to receive at least two inputs, an up signal 24 and a down signal 25. This is in contrast with conventional charge pumps which typically require four input signals, an up, a down, an nbias, and a pbias signal (not depicted) to be provided by block 16. Instead, in CP 12, which is a self-biased circuit, the output of the charge pump stage 106 is used as nbias, and the pbias signal may be generated within the CP 12 based at least in part on the nbias signal 114 as will be described below. For purposes of this description, the nbias and the pbias signals may be referred to as bias inputs. Note again that the nbias signal 114, in various embodiments, may be provided by a feedback loop 450 from the outputted control voltage 26 as illustrated in FIG. 3.

In various embodiments, before the DLL 10 is enabled, the nbias (i.e., Vctl) 114 or 26 is pre-charged to a certain voltage, for example, Vcc. After the reference clock is stable, the DLL 10 is enabled and the locking process starts. Nbias (Vctl) 114 or 26 reaches a stable voltage when DLL 10 is locked. The nbias (Vctl) value may depend on the reference clock frequency, and the process/voltage/temperature conditions. The pbias is then generated based on nbias voltage.

In CP 12, the up and down signals 24 and 25 may be received by the CP stage 106, while the nbias signal 114, which is a bias input, may be received by both the feedback loop 102 and the CP stage 106. The self-biased differential amplifier 104 and the replica CP stage 105 of the feedback loop 102, working cooperatively, and based at least in part on the nbias signal 114, may generate another bias input (i.e., pbias signal) that may also be provided to the CP stage 106. Thus, in contrast to conventional charge pumps, which typically use the same pbias signal as the delay cells 18, the CP 12 generates its own pbias signal. Based on the up and down signals 24 and 25, the nbias signal 114, and the pbias signal generated by the feedback loop 102, the CP stage 106 may affect the output of the output voltage (i.e., control voltage 26).

Figure 3:
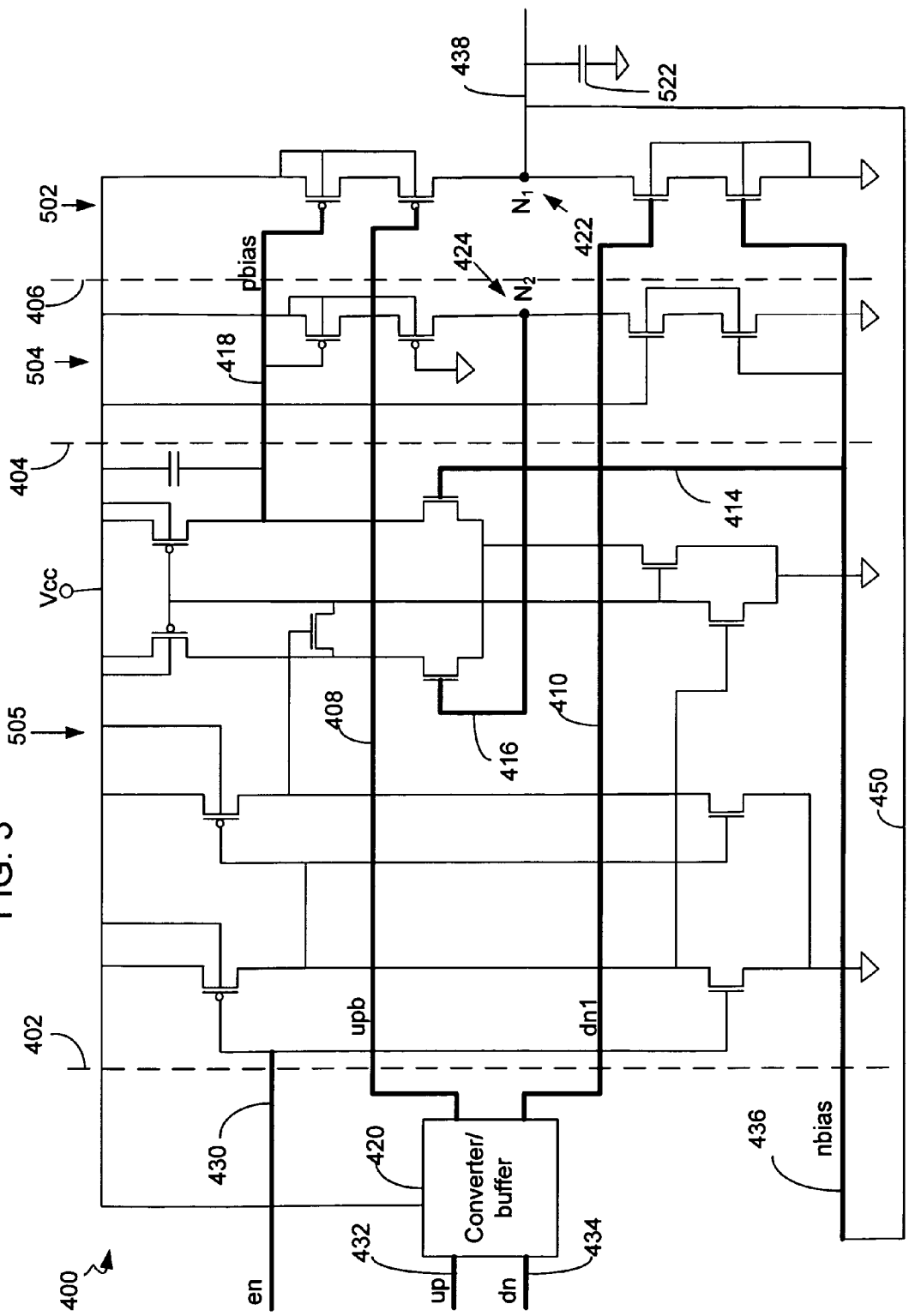
FIG. 3 illustrates a charge pump circuit in accordance with various embodiments of the present invention.

FIG. 3 depicts a charge pump (CP) circuit in accordance with various embodiments of the present invention. The CP circuit 400 may be divided into three sections, a self-biased differential amplifier 505 that is located between dashed lines 402 and 404 (excluding Vcc), a replica charge pump (CP) stage 504 located between dashed lines 404 and 406, and a charge pump (CP) stage 502 located to the right of dashed line 406. The CP stage 502 comprises of four transistors (two NMOS and two PMOS transistors) and a first node 422 coupled to the output terminal 438. In brief, the CP stage 502 directly controls the output voltage (i.e., control voltage) at the output terminal 438 of the CP circuit 400. In some embodiments, the CP stage 502 is the scaled version of the delay cells 18 of FIG. 1. A more detailed description of the CP stage 502 is described below with reference to FIG. 4.

Coupled to the CP stage 502 is the replica CP stage 504 that generally mirrors the CP stage 502, both stages having similar structures and similar components. Included in the replica CP stage 504 is a second node 424 that mirrors the first node 422 of the CP stage 502. In particular, the voltage at the second node 424 tracks the voltage at the first node 422 across frequency and PVT variations.

Coupled to the CP stage 502 and the replica CP stage 504 is the self-biased differential amplifier circuit 505. As depicted, the self-biased differential amplifier 505 includes assorted components such as NMOS and PMOS transistors coupled together as shown. The self-biased differential amplifier 505 and the replica CP stage 504 may form a negative feedback loop that may generate a pbias signal that may then be provided the CP stage 502 via line 418.

The CP circuit 400 may further include a converter/buffer 420 and a charge capacitor 522 coupled to the output terminal 438 of the CP stage 502. Input to the CP circuit 400 may be received through enable line 430, up signal line 432, and down signal line 434. The enable line 430 may receive an enable signal to enable or disable the CP circuit 400. For example, logic one may enable the CP circuit 400 while logic zero may disable the CP circuit 400. The up and down signal lines 432 and 434 may receive up and down (dn) signals from, for example, a phase frequency detector (PFD) of a DLL (or PLL). The nbias line 436 receives a bias input from the output of the CP stage 502 (i.e., control voltage at output terminal 438) via loop 450 as illustrated.

Operationally, up and down signals received through the up and down signal lines 432 and 434, may facilitate the control or generation of a control voltage (i.e., output voltage) at output terminal 438. In particular, the up and down signals may initially be received by the converter/buffer 420 via the up and down lines 432 and 434. The converter/buffer 420 may then take the up signal and convert it to an upb signal (inverts up to upb), and may buffer the down (dn) signal to a dn1 signal. In some embodiments, the delay between the up and the upb signals, and the delay between the dn and dn1 signals are the same. Note that in FIG. 4 some of the connection lines of the CP circuit 400 are in bold to facilitate a better understanding of the CP circuit 400. The upb and the dn1 signals are then transmitted to the CP stage via lines 408 and 410.

A bias input, such as an nbias signal, received through nbias line 436 may be routed to the CP stage 502, as well as routed to the self-biased differential amplifier 505 via line 414. Note that the self-biased differential amplifier 505 is coupled to the second node 424 of the replica CP stage 504 via line 416. Based on the voltage at the second node 424 and the bias input (i.e., nbias signal) received through line 414, the self-biased differential amplifier 505 generates the pbias signal that is provided to the CP stage 502 via line 418. To summarize the above, lines 418, 408, 410, and 436 represent the input lines to the CP stage 502 for the pbias, upb, dn1, and nbias signals, respectively.

Again note that the pbias signal received by the CP stage 502 through input line 418 is generated by the feedback loop (i.e., self-biased differential amplifier 505 and replica CP stage 504) in contrast to conventional charge pumps. That is, in a conventional charge pump, which may have a similar structure and components as the CP stage 502, the pbias signal is typically provided by block 16 (i.e., pbias generator) of the DLL 10. In contrast, the pbias signal here is self-generated by the CP circuit 400.

Figure 4:
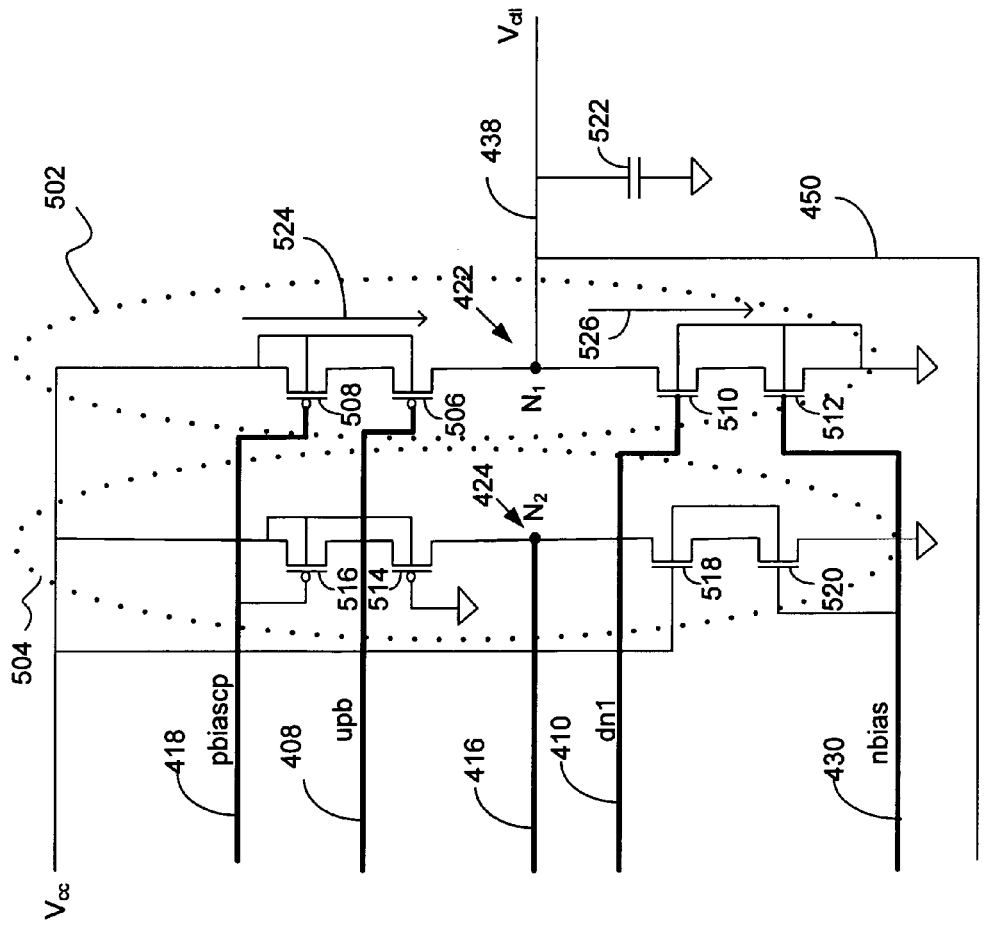
FIG. 4 illustrates the charge pump stage and the replica charge pump stage of the charge pump circuit of FIG. 3 in accordance with various embodiments of the present invention.

FIG. 4 shows the CP and replica CP stages 502 and 504 of FIG. 3 in accordance with various embodiments of the present invention. The CP stage 502 includes a first set of transistors including a first and a second transistor 506 and 508 that are PMOS transistors, and a second set of transistors including a third and a fourth transistor 510 and 512 that are NMOS transistors. The first and third transistors 506 and 510 are electronically coupled to the first node 422, which is further coupled to the output terminal 438. The two sets of transistors may be referred to as a voltage divider and may cooperatively work together to generate and/or control the output voltage at the output terminal 438.

In various embodiments, the two PMOS transistors 506 and 508 are switches for a pull-up current source while the two NMOS transistors 510 and 512 may be switches for a pull-down current source. The current sources may be biased by the nbias and the pbias signals (i.e., bias inputs) received by the CP stage 502 via lines 430 and 418.

For the embodiments, the first transistor 506 is adapted to receive a current through the second transistor 508. The gate of the first transistor 506 is coupled to line 408; thus, the operation of the first transistor 506 is controlled by the upb signal received through line 408. The second transistor 508, which is coupled to the first transistor 506, biases the current received by the first transistor 506. The gate of the second transistor 508 is coupled to line 418, and as a result, the operations of the second transistor 508 is controlled by the pbias signal (i.e., first bias input) received through line 418.

The third transistor 510 is adapted to receive a current through the first node 422. The gate of the third transistor 510 is coupled to line 410 and as a result, the operation of the third transistor 510 is controlled by the dn1 signal received through line 410. The fourth transistor 512, which is coupled to the third transistor 510, may bias the current received by the third transistor 510. The gate of the fourth transistor 512 is coupled to line 430, and as a result, the operation of the fourth transistor 512 is controlled by the nbias signal (i.e., second bias input) received through line 430.

As previously alluded to, the replica CP stage 504 has a structure and components that substantially mirror those of the CP stage 502. The replica CP stage 504 includes a set of PMOS transistors 514 and 516 that mirrors the PMOS transistors 506 and 508 of the CP stage 502. The replica CP stage 504 further includes a set of NMOS transistors 518 and 520 that mirror the NMOS transistors 510 and 512 of the CP stage 502. The voltage of the second node 424 of the replica CP stage 504 may substantially mirror the output voltage of the first node 422 as previously described. The voltage of the second node 424 is sampled by the self-biased differential amplifier 505 via line 416 (see FIG. 3), the self-biased differential amplifier 505 generates the pbias signal that may be routed to the gate of the second transistor 508.

In the coincident zone where both up and down signals from phase detector are high, it may be desirable that no net charge is injected to the charge pump capacitor. In such situations, the pbias signal generated by the feedback loop (i.e., self-biased differential amplifier 505 and the replica CP stage 504) and used to control the second transistor 508 may be adjusted by the feedback loop such that it tracks the nbias signal so that the pull-up current 524 and the pull-down current 526 of the charge pump may be matched. Consequently, no net charge is injected or ejected to or from the CP capacitor 522 regardless of frequency and PVT variations. As a result, in some embodiments, zero or near zero phase error may be achieved.

Thus, an adaptive zero-offset charge pump has been described. The word "adaptive" is used because the charge pump current or signal may be compensated for PVT variation using nbias, making the loop bandwidth relatively constant over PVT variations and frequency changes, and therefore, may result in improved phase error and jitter performance over frequency range and PVT variations.

Figure 5:
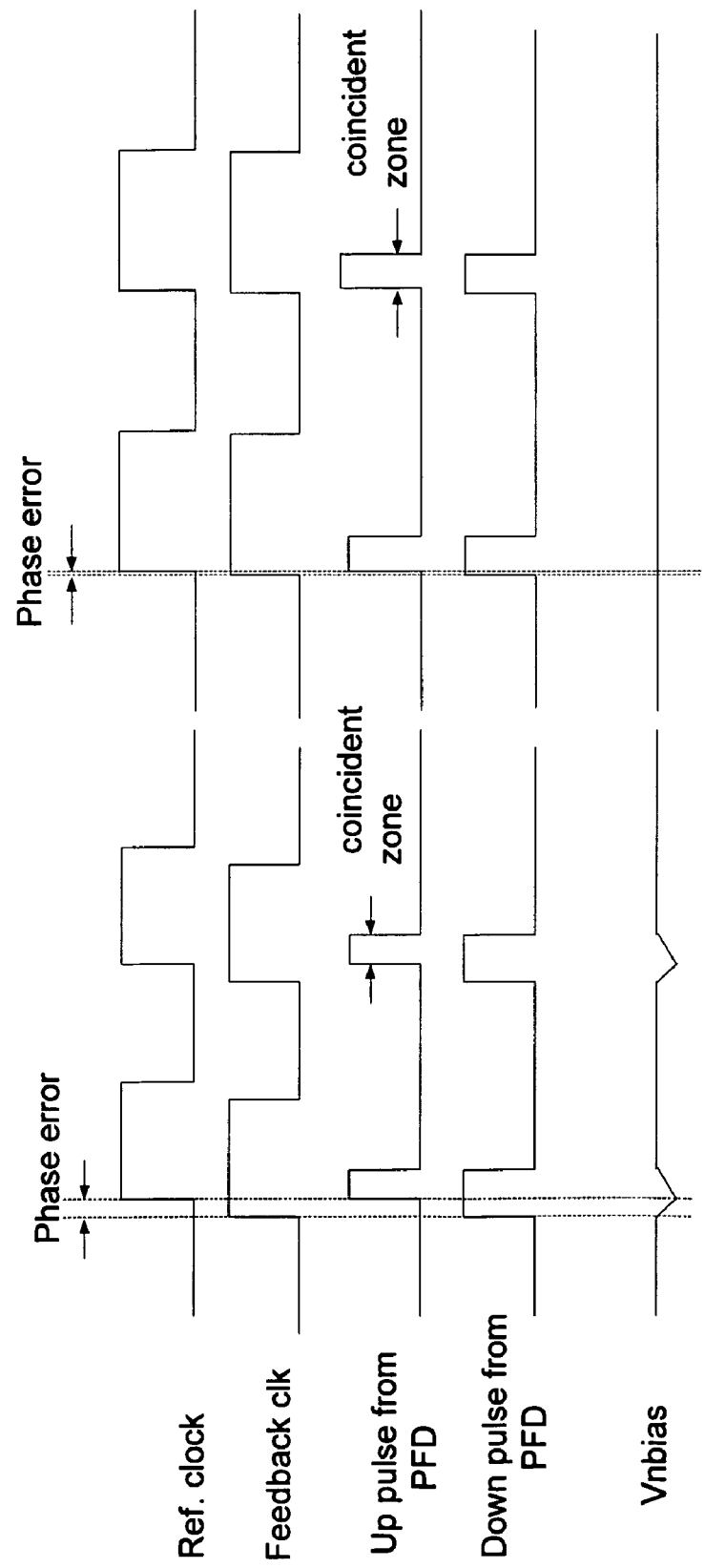
FIG. 5 illustrates waveforms in a conventional charge pump and waveforms in a adaptive zero-offset charge pump in accordance with various embodiments of the present invention.

FIG. 5 depicts waveforms in both a conventional charge pump and in the adaptive zero-offset charge pump as described above. As previously indicated, conventional charge pumps may use the same nbias and pbias from the DLL delay line (or VCO for PLLs) to bias the pull-down and pull-up current sources. Generally, when up and down signals go high in the coincident zone (the coincident zone being the period in which both the up and down signals are turn on during phase comparison), which may be about 40 ps, both pull-up and pull-down currents 524 and 526 are turned on (see, for example, FIG. 3). In such a situation, it may be ideal for the pull-up current 524 to be the same as pull-down current 526, so that no net charge is injected to the CP capacitor 522 in the coincident time zone.

For a given nbias and pull-down current 526, pull-up current 524 may be determined by the pbias value. If the pbias value is not properly set at the proper value, the pull-down current 526 and the pull-up current 524 may be unequal, which may ultimately result in phase error. For example, in a conventional charge pump (that have, for example, the same structure as the CP stage 502 and that further includes CP capacitor 522), there may be situations where the value of the pbias is such that the pull-up current 524 is bigger than the pull-down current 526. As a result, there may be a net pull-up current during coincident time period in each cycle, and the voltage across the CP capacitor 522 may be increased at each phase comparison. This may be a less than ideal situation since under locked conditions the average value of the control voltage (i.e., control voltage at output terminal 438) should remain constant. As a result of the net pull-up current, an extra charge may result in the CP capacitor 522. The extra charge may have to be cancelled by an increase in pull-down time in each cycle, which causes an increase in phase error, as shown in the left side of FIG. 5 (i.e., waveforms in a conventional charge pump).

The right side of FIG. 5, in contrast, shows the waveforms in an adaptive zero-offset charge pump, which again, includes the feedback loop shown in FIGS. 2 and 3. The feedback loop may adjust the pbias to make sure that the output (i.e., control voltage) of the CP stage 502 tracks nbias for all PVT conditions when both pull-up and pull-down currents 524 and 526 are in the coincident zone. As a result, no net charge is injected into the CP capacitor 522 during coincident time, and close to zero phase error may be achieved.

Figure 6:
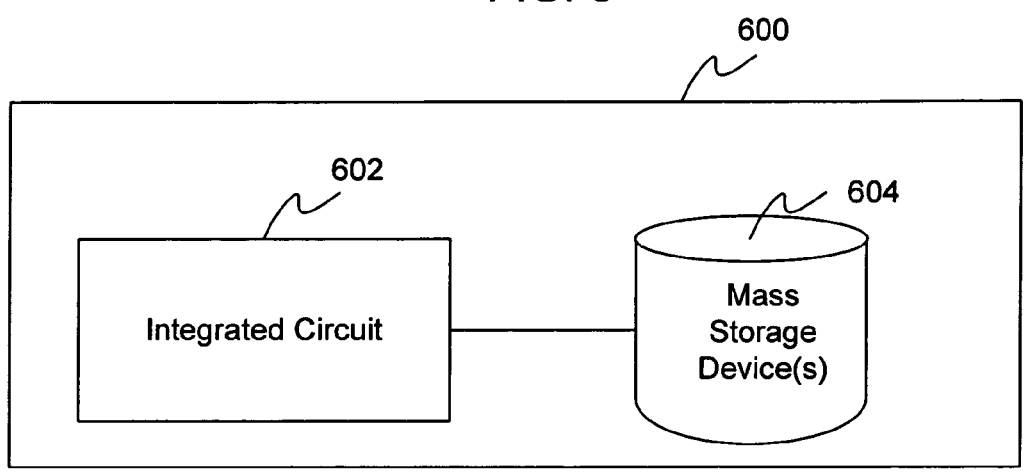
FIG. 6 illustrates a system in accordance with various embodiments of the present invention.

Simulations had been performed for comparing a DLL design employing the prior art charge pump and the adaptive zero-offset charge pump described above. The results of a simulation performed at 3.2 GHz show that the DLL employing the prior art charge pump having a phase error of approximately 1.9 ps and the DLL employing the adaptive zero-offset charge pump having a phase error of approximately 0.2 ps, suggesting a reduction of the phase error by as much as 90%. That is, the phase error under the prior art design appears to be about nine times larger than the phase error under the simulated embodiment of the invention FIG. 6 depicts a system in accordance with various embodiments of the present invention. The system 600 comprises an integrated circuit 602 and mass storage device(s) 604, coupled together as shown. The circuit 602 may include a PLL and/or a DLL that includes the charge pump as previously described. In some embodiments, the circuit 602 may be a microprocessor. Although not depicted, the system 600 may further include additional components such as buses, volatile memory, input/output devices, and so forth. One or more of these other components may also include a DLL and/or a PLL that include the charge pump described previously.

In various embodiments, the mass storage device(s) 604 and the circuit 602 (except for the teachings of embodiments of the invention incorporated therein) represent a broad range of elements known in the art. For example, the mass storage device(s) 604 may include optical storage, magnetic storage such as disk drive, and so forth. Further, system 600 may be embodied in a broad range of form factors for a broad range of general or special purpose applications including, for example, a wireless adaptor, a wireless mobile phone, a set-top box, a personal digital assistant, a tablet computing device, a desktop computing device, a laptop computing device, and/or an entertainment control unit. System 600 may be endowed with various operating systems and/or applications to solve various computing problems.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A charge pump, comprising:
an output terminal;
a charge pump stage coupled to the output terminal to output at the output terminal a voltage, said charge pump stage including a first transistor to receive a current and a second transistor coupled to the first transistor to bias the current received by the first transistor: and
a feedback loop coupled to the charge pump stage to generate a bias input for the charge pump stage to affect the output of the output voltage, wherein the feedback loop comprises a replica of the charge pump stage having a structure and components that substantially mirror the structure and components of the charge pump stage, including a node to have a voltage that mirrors the output voltage of the output terminal of charge pump stage,
wherein the second transistor is coupled to the feedback loop, the feedback loop adapted to provide, selectively, a bias input to the second transistor, and to bias the current received by the first transistor based at least in part on the received bias input.

2. The charge pump of claim 1, wherein said charge pump stage further comprises a third transistor to receive another current and a fourth transistor coupled to the third transistor to bias the other received current, the fourth transistor to receive another bias input and to bias the current received by the third transistor based at least in part on the other bias input, the bias input being generated by the feedback loop based at least in part on the other bias input.

3. The charge pump of claim 2, wherein the first and third transistors of the charge pump stage are electronically coupled together through a node, to which the output terminal is coupled.

4. A charge pump, comprising:
an output terminal;
a charge pump stage coupled to the output terminal to output at the output terminal a voltage; and
a feedback loop coupled to the charge pump stage to generate a bias input for the charge pump stage to affect the output of the output voltage;
wherein said charge pump stage comprises a first transistor to receive a current and a second transistor coupled to the first transistor to bias the current received by the first transistor, the second transistor being coupled to the feedback loop to receive the bias input from the feedback loop and to bias the current received by the first transistor based at least in part on the received bias input;
wherein said charge pump stage further comprises a third transistor to receive another current and a fourth transistor coupled to the third transistor to bias the other received current, the fourth transistor to receive another bias input and to bias the current received by the third transistor based at least in part on the other bias input, the bias input being generated by the feedback loop based at least in part on the other bias input;
wherein said feedback loop is adapted to provide, selectively, bias input to the second transistor to match the current received by the first transistor with the other current received by the third transistor.

5. A charge pump, comprising:
an output terminal;
a charge pump stage coupled to the output terminal to output at the output terminal a voltage; and
a feedback loop coupled to the charge pump stage to generate a bias input for the charge pump stage to affect the output of the output voltage,
wherein the feedback loop comprises a replica of the charge pump stage having a structure and components that substantially mirror the structure and components of the charge pump stage, including a node to have a voltage that mirrors the output voltage of the output terminal of charge pump stage, and
wherein the feedback loop further comprises a self-biased differential amplifier coupled to the charge pump stage and the replica charge pump stage, to provide the bias input for the charge pump, the self-biased differential amplifier including an input line to receive another bias input, and being adapted to provide the bias input for the charge pump stage based at least in part on the other bias input and the voltage at the node of the replica charge pump stage.

6. The charge pump of claim 4, further comprising phase frequency detector coupled to the charge pump stage designed to provide an up and/or a down signal to the charge pump stage, the charge pump further outputting the output voltage based on the up and/or down signal.

7. A method, comprising:
receiving a first bias input to be provided to a charge pump stage of a charge pump; and
generating a second bias input based at least in part on the first bias input to be provided to the charge pump stage to affect an output voltage at an output terminal of the charge pump stage,
wherein said generating comprises generating the second bias input based further on a voltage of a node of a replica charge pump stage coupled to the charge pump stage, the voltage of the node mirroring the output voltage of the charge pump stage, and
wherein the charge pump stage comprises a first transistor to receive a current and a second transistor coupled to the first transistor to bias the current received by the first transistor, and the method further comprising providing the second bias input to the second transistor, via a feedback loop adapted to provide, selectively, the second bias input to the second transistor, the current received by the first transistor based at least in part on the second bias input.

8. The method of claim 7, wherein the charge pump stage further comprises a third transistor to receive another current and a fourth transistor coupled to the third transistor to bias the other received current, and the method further comprising providing the first bias input to the fourth transistor to bias the current received by the third transistor based at least in part on the first bias input.

9. A method, comprising:
receiving a first bias input to be provided to a charge pump stage of a charge pump;
generating a second bias input based at least in part on the first bias input to be provided to the charge pump stage to affect an output voltage at an output terminal of the charge pump stage;
wherein the charge pump stage comprises a first transistor to receive a current and a second transistor coupled to the first transistor to bias the current received by the first transistor, and the method further comprising providing the second bias input to the second transistor to bias the current received by the first transistor based at least in part on the second bias input;
wherein the charge pump stage further comprises a third transistor to receive another current and a fourth transistor coupled to the third transistor to bias the other received current, and the method further comprising providing the first bias input to the fourth transistor to bias the current received by the third transistor based at least in part on the first bias input; and
the method further comprising receiving by the first and the third transistors of an up and a down signal, respectively, to facilitate the reception of the current and the other current by the first and the second transistors.

10. The method of claim 9, wherein the up and a down signal are to be received from a phase frequency detector.

11. The method of claim 7, wherein the output voltage is provided to one or more delay cells and based at least in part on the output voltage, the delay cells to output a clock signal.

12. The method of claim 7, wherein the output voltage is provided to a voltage controlled oscillator and based at least in part on the output voltage, the voltage controlled oscillator to output a clock signal.

13. The method of claim 9, wherein said receiving comprises receiving a first bias input from the output terminal of the charge pump stage.

14. A system, comprising:
a charge pump, including:
an output terminal,
a charge pump stage coupled to the output terminal to output a voltage at the output terminal, said charge pump stage including a first transistor to receive a current and a second transistor coupled to the first transistor to bias the current received by the first transistor; and
a feedback loop coupled to the charge pump stage to generate a bias input for the charge pump stage to affect the output of the output voltage, wherein the feedback loop comprises a replica of the charge pump stage having a structure and components that substantially mirror the structure and components of the charge pump stage, including a node to have a voltage that mirrors the output voltage of the output terminal of charge pump stage, wherein the second transistor is coupled to the feedback loop to receive the bias input from the feedback loop, the feedback loop adapted to provide, selectively, the bias input to the second transistor, and to bias the current received by the first transistor based at least in part on the received bias input; and
one or more mass storage devices coupled to the charge pump.

15. The system of claim 14, wherein the system comprises a delay locked loop or a phase locked loop, and the charge pump is a member of the delay or phase locked loop.

16. The system of claim 15, wherein the system comprises a delay locked loop further including a delay cell coupled to the charge pump.

17. The system of claim 15, wherein the system comprises a phase locked loop further including a voltage controlled oscillator coupled to the charge pump.

18. The system of claim 14, wherein the system is a selected one of a wireless adaptor, a wireless mobile phone, a set-top box, a personal digital assistant, a tablet computing device, a laptop computing device, a desktop computing device, or an entertainment control unit.

19. A circuit, comprising:
a charge pump, including:
an output terminal;
a charge pump stage coupled to the output terminal to output at the output terminal a voltage; and
a feedback loop coupled to the charge pump stage to generate a bias input for the charge pump stage to affect the output of the output voltage; and
a phase frequency detector coupled to the charge pump to generate an up and/or down signal for the charge pump to facilitate said output of said voltage at the output terminal;
wherein said charge pump stage comprises a first transistor to receive a current and a second transistor coupled to the first transistor to bias the current received by the first transistor, the second transistor being coupled to the feedback loop to receive the bias input from the feedback loop and to bias the current received by the first transistor based at least in part on the received bias input;
wherein said charge pump stage further comprises a third transistor to receive another current and a fourth transistor coupled to the third transistor to bias the other received current, the fourth transistor to receive another bias input and to bias the current received by the third transistor based at least in part on the other bias input, the bias input being generated by the feedback loop based at least in part on the other bias input;

wherein said feedback loop is adapted to provide, selectively, bias input to the second transistor to match the current received by the first transistor with the other current received by the third transistor.

20. The circuit of claim 19, further comprising delay cells coupled to the output terminal to generate a clock signal based at least in part on the output voltage.

21. The circuit of claim 19, further comprising voltage controlled oscillator coupled to the output terminal to generate a clock signal based at least in part on the output voltage.

* * * * *

UNITED STATES PATENT AND TRADEMARK OFFICE
CERTIFICATE OF CORRECTION

PATENT NO. : 7,471,157 B2 Page 1 of 1
APPLICATION NO. : 11/471756
DATED : December 30, 2008
INVENTOR(S) : Yongping Fan It is certified that error appears in the above-identified patent and that said Letters Patent is hereby corrected as shown below:

Column 7
Line 61, "...transistor: and..." should read --...transistor; and...--.

Column 9
Lines 59-60, "...the up and a down signal..." should read --...the up and the down signal...--.

Column 10
Line 2, "...a first bias input..." should read --...the first bias input...--.

Signed and Sealed this

Ninth Day of February, 2010

David J. Kappos
*Director of the United States Patent and Trademark Office*